(12) United States Patent
Li

(10) Patent No.: US 10,746,347 B2
(45) Date of Patent: Aug. 18, 2020

(54) DISPLAY DEVICE

(71) Applicant: HONGFUJIN PRECISION ELECTRONICS (CHONGQING) CO., LTD., Chongqing (CN)

(72) Inventor: Hong-Xuan Li, Chongqing (CN)

(73) Assignee: HONGFUJIN PRECISION ELECTRONICS (CHONGQING) CO., LTD., Chongqing (CN)

( * ) Notice: Subject to any disclaimer, the term of this patent is extended or adjusted under 35 U.S.C. 154(b) by 2 days.

(21) Appl. No.: 16/184,911

(22) Filed: Nov. 8, 2018

(65) Prior Publication Data
US 2019/0327841 A1 Oct. 24, 2019

(30) Foreign Application Priority Data
Apr. 19, 2018 (CN) .......................... 2018 1 0356019

(51) Int. Cl.
| | |
|---|---|
| *F16M 11/10* | (2006.01) |
| *H05K 5/00* | (2006.01) |
| *F16M 11/12* | (2006.01) |
| *H05K 5/02* | (2006.01) |
| *H05K 5/03* | (2006.01) |

(52) U.S. Cl.
CPC ......... *F16M 11/105* (2013.01); *F16M 11/125* (2013.01); *H05K 5/0017* (2013.01); *H05K 5/0226* (2013.01); *H05K 5/03* (2013.01); *H05K 5/0234* (2013.01)

(58) Field of Classification Search
CPC ... F16M 11/105; F16M 11/125; H05K 5/0017
See application file for complete search history.

(56) References Cited

U.S. PATENT DOCUMENTS

| | | | | |
|---|---|---|---|---|
| 6,189,850 | B1 * | 2/2001 | Liao ..................... | F16M 11/105 248/292.14 |
| 7,506,850 | B2 * | 3/2009 | Chang .................. | F16M 11/041 248/221.11 |
| 7,643,276 | B2 * | 1/2010 | Shin ..................... | F16M 11/105 248/917 |
| 7,673,838 | B2 * | 3/2010 | Oddsen, Jr. .......... | F16M 11/041 248/221.11 |
| 7,712,711 | B2 * | 5/2010 | Jang ..................... | F16M 11/105 248/125.8 |
| 7,810,776 | B2 * | 10/2010 | Long ..................... | E05D 15/22 248/176.1 |

(Continued)

*Primary Examiner* — Eret C McNichols
(74) *Attorney, Agent, or Firm* — ScienBiziP, P.C.

(57) ABSTRACT

A display device includes a support structure and back cover coupled to the support structure. The support structure includes a support frame, a positioning assembly, a connecting structure coupled to the back cover and the positioning assembly, and a rotating member including a hook portion and coupled to the support frame and rotationally coupled to the positioning assembly. The back cover includes a sliding rail protruding from a side thereof adjacent to the support frame. When the support frame rotates parallel to the back cover from a first position to a second position, the hook portion moves from one end of the sliding rail toward the sliding rail until the hook portion is hooked onto the sliding rail and the support structure is fixed to the back cover.

7 Claims, 6 Drawing Sheets

(56) References Cited

U.S. PATENT DOCUMENTS

| | | | | |
|---|---|---|---|---|
| 8,083,193 B2* | 12/2011 | Matsui | F16M 11/041 | 248/221.11 |
| 8,523,131 B2* | 9/2013 | Derry | F16M 11/04 | 16/338 |
| 9,282,670 B2* | 3/2016 | Chiang | H05K 7/14 | |
| 2002/0084396 A1* | 7/2002 | Weaver | F16M 11/10 | 248/278.1 |
| 2004/0012917 A1* | 1/2004 | Jung | F16M 11/10 | 361/679.02 |
| 2005/0006542 A1* | 1/2005 | Henning | F16C 11/10 | 248/274.1 |
| 2007/0040084 A1* | 2/2007 | Sturman | F16M 11/105 | 248/280.11 |
| 2007/0195495 A1* | 8/2007 | Kim | F16M 11/105 | 361/679.07 |
| 2007/0215762 A1* | 9/2007 | Lee | F16M 11/08 | 248/125.7 |
| 2007/0217134 A1* | 9/2007 | Shin | F16M 11/105 | 361/679.07 |
| 2008/0100997 A1* | 5/2008 | Chen | G06F 1/1601 | 361/679.01 |
| 2010/0091438 A1* | 4/2010 | Dittmer | F16M 11/10 | 361/679.01 |
| 2010/0188804 A1* | 7/2010 | Jang | F16M 11/105 | 361/679.01 |
| 2010/0219303 A1* | 9/2010 | Matsui | F16M 11/041 | 248/122.1 |
| 2011/0031360 A1* | 2/2011 | Pan | F16M 11/10 | 248/201 |
| 2011/0267748 A1* | 11/2011 | Lane | A45F 5/00 | 361/679.01 |
| 2012/0043446 A1* | 2/2012 | Britton | F16M 11/08 | 248/349.1 |
| 2014/0001331 A1* | 1/2014 | Oddsen, Jr. | F16M 11/04 | 248/292.13 |
| 2015/0211675 A1* | 7/2015 | Shyu | F16M 11/046 | 248/125.7 |
| 2017/0051866 A1* | 2/2017 | Chen | F16M 11/041 | |

* cited by examiner

DISPLAY DEVICE

FIELD

The subject matter herein generally relates to display devices, and more particularly to a display device having an improved connecting structure for connecting a display screen to a support structure.

BACKGROUND

Generally, a display device includes a display screen and a support structure. The support structure supports a back cover of the display screen. The support structure is usually fixed to the back cover by screws.

BRIEF DESCRIPTION OF THE DRAWINGS

Implementations of the present disclosure will now be described, by way of example only, with reference to the attached figures.

DETAILED DESCRIPTION

Figure 1:
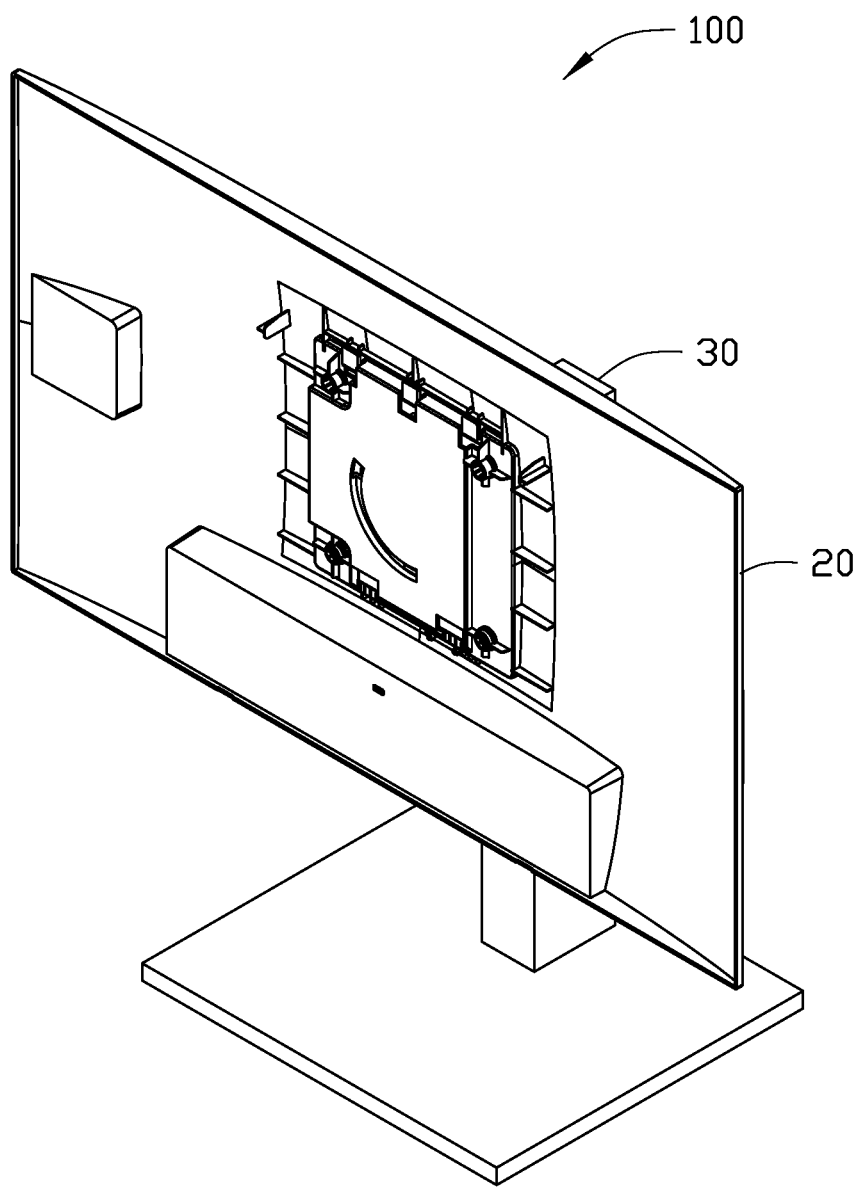
FIG. 1 is an assembled, isometric view of an embodiment of a display device including a back cover and a support structure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
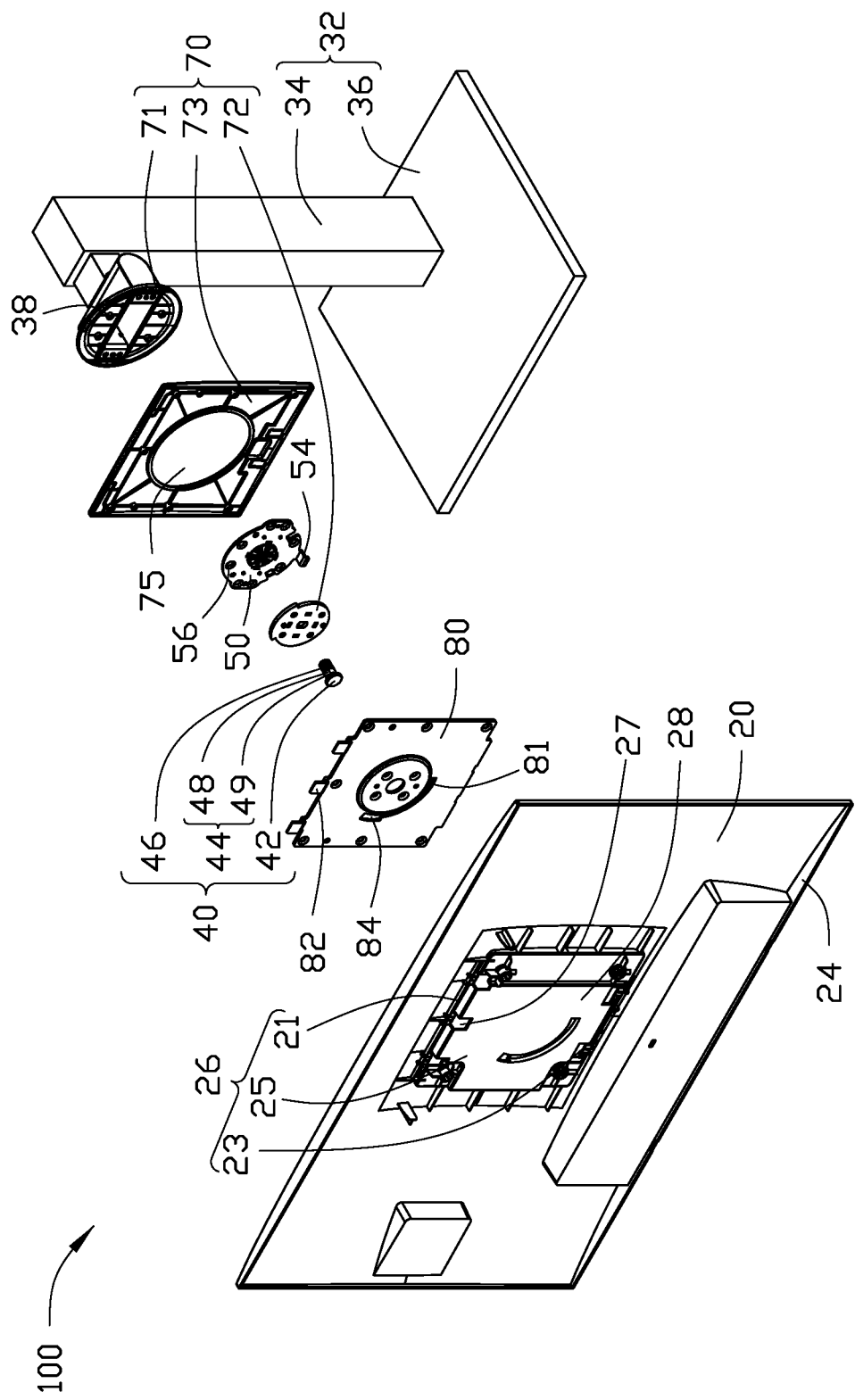
FIG. 2 is an exploded, isometric view of the display device in FIG. 1.
Figure 3:
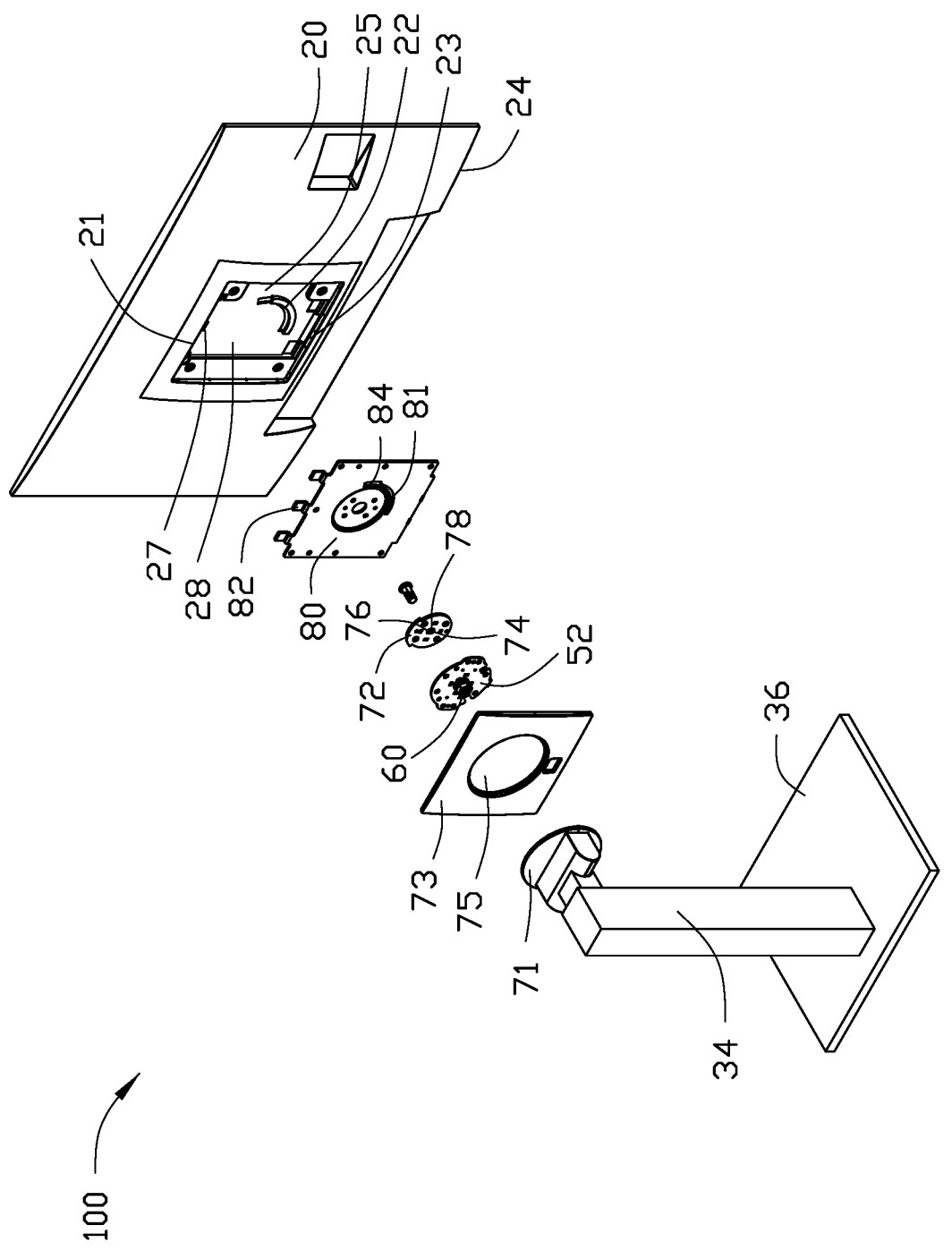
FIG. 3 is similar to FIG. 2, but shows the display device from another angle.
Figure 4:
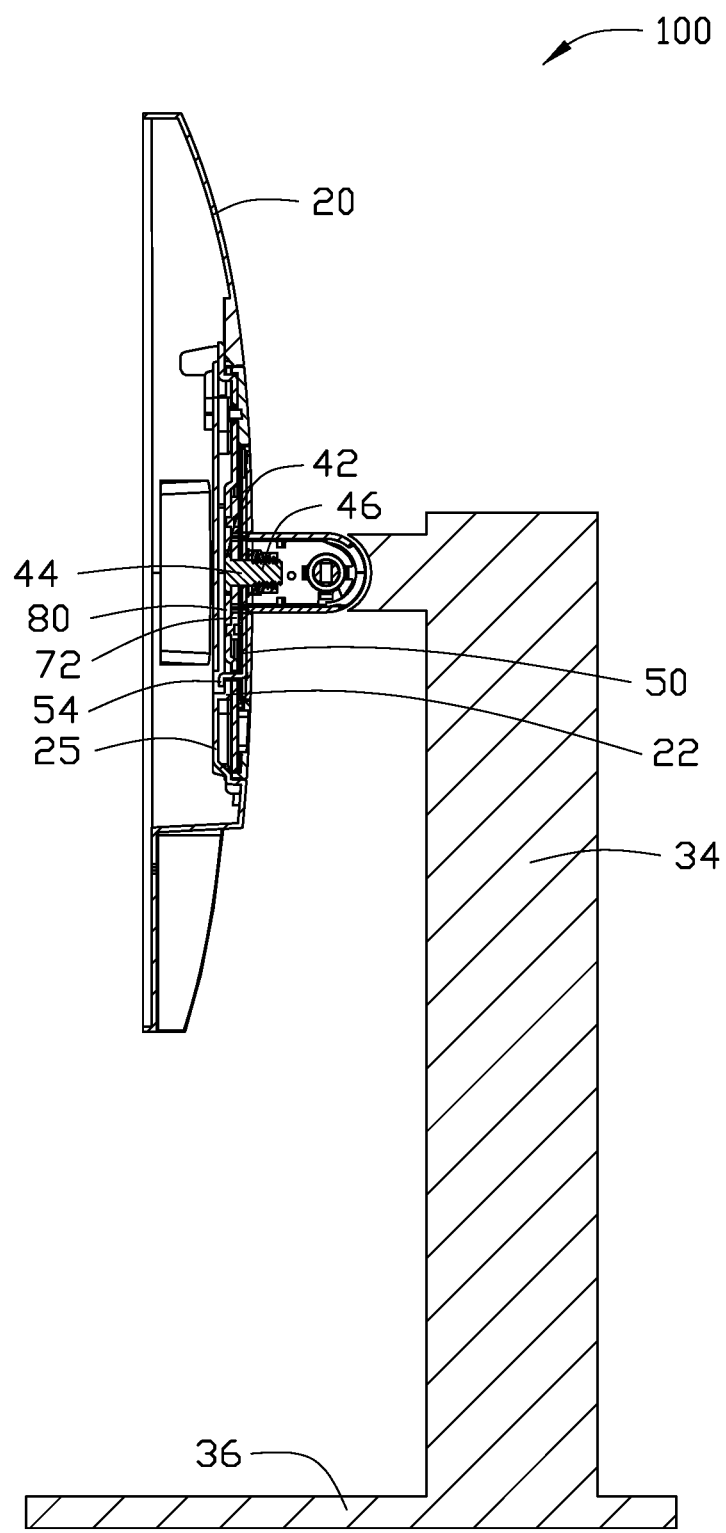
FIG. 4 is a side view of the display device in FIG. 1.
Figure 5:
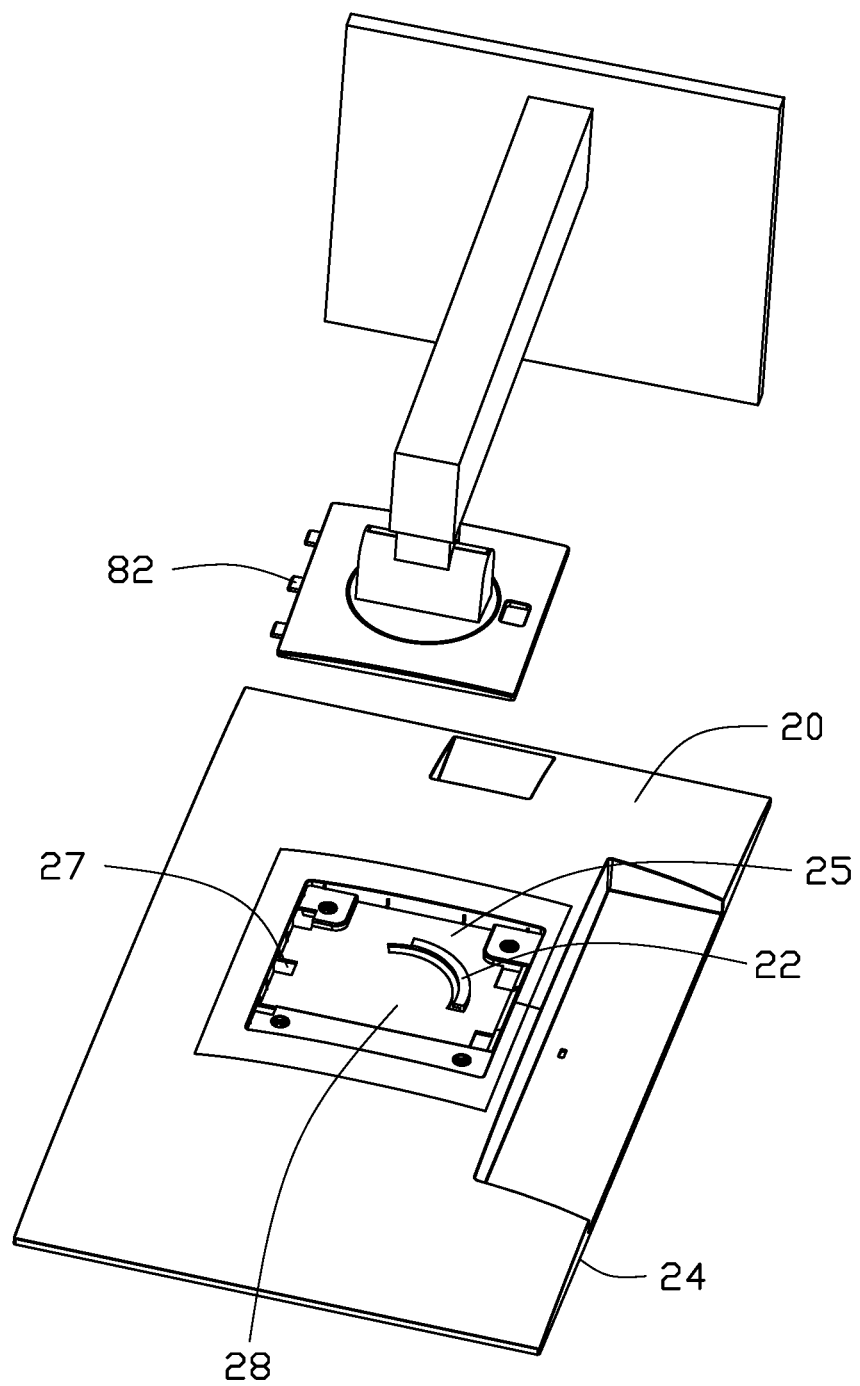
FIG. 5 is an isometric view of the display device in FIG. 1 showing the back cover disassembled from the support structure.
Figure 6:
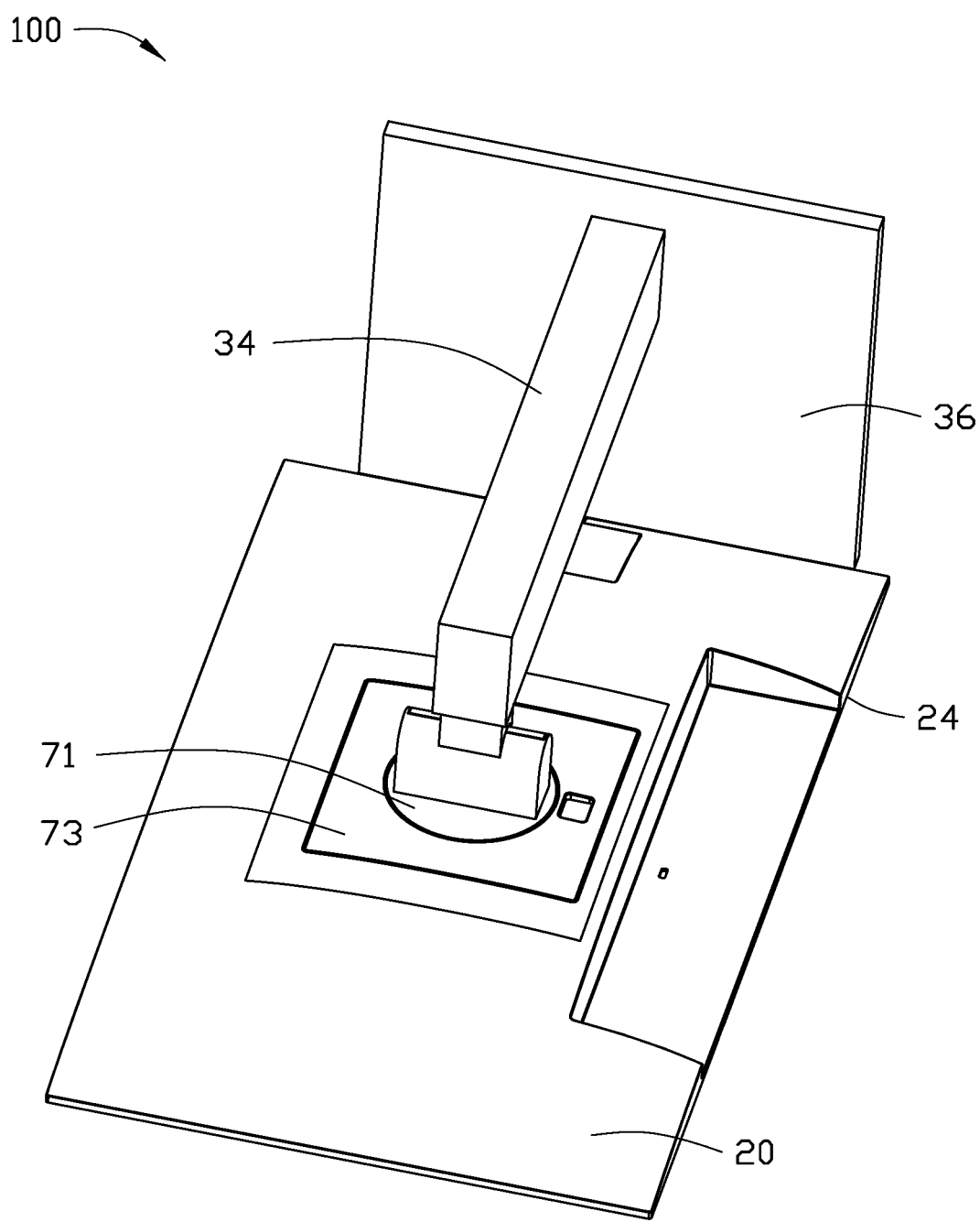
FIG. 6 is an isometric view of the display device in FIG. 1 showing the back cover installed onto the support structure.

FIGS. 1-6 illustrate an embodiment of a display device 100 including a back cover 20 and a support structure 30. The support structure 30 is coupled to and supports the back cover 20. The support structure 30 includes a support frame 32, a positioning assembly 40, a rotating member 50, and a connecting structure 70. The connecting structure 70 is coupled to the back cover 20 and the positioning assembly 40. The rotating member 50 is coupled to the support frame 32 and rotationally coupled to the positioning assembly 40. The rotating member 50 includes a hook portion 54. The back cover 20 includes a sliding rail 22 on a side thereof adjacent to the support frame 32. When the support frame 32 rotates parallel to the back cover 20 from a first position to a second position, the hook portion 54 moves from one end of the sliding rail 22 toward the sliding rail 22 until the hook portion 54 hooks onto the sliding rail 22 to fix the support structure 30 to the back cover 20.

The support frame 32 includes a support body 34 and a support base 36 coupled perpendicularly to the support body 34. The back cover 20 includes a bottom edge 24. When the support frame 32 is in the first position, the support body 34 is parallel to the bottom edge 24. When the support frame 32 is in the second position, the support body 34 is perpendicular to the bottom edge 24 and supports the back cover 20.

The connecting structure 70 includes a fixing plate 72 coupled to the positioning assembly 40 and a connecting plate 80 coupled to the fixing plate 72. The connecting plate 80 includes at least one tab 82 protruding from an outer periphery thereof. The back cover 20 includes a recessed portion 26. The recessed portion 26 surrounds an accommodating area 28. The recessed portion 26 includes a first side 21, a second side 23, and a connecting piece 25 coupled between the first side 21 and the second side 23. The sliding rail 22 protrudes from the connecting piece 25. The first side 21 defines at least one accommodating hole 27. The at least one tab 82 is received within the at least one accommodating hole 27, and the connecting plate 80 abuts between the first side 21 and the second side 23. In the first position, the at least one tab 82 is received within the at least one accommodating hole 27 to couple the connecting structure 70 to the back cover 20. When disassembling the support structure 30, the support frame 32 is rotated to the first position to cause the connecting structure 70 to rotate away from the back cover 20 thereby causing the connecting plate 80 to rotate away from the back cover 20, and when a side of the connecting plate 80 opposite from the at least one tab 82 is removed from the accommodating area 28, the at least one tab 82 is removed from the accommodating hole 27 along a direction away from the first side 21. Thus, the support structure 30 is disassembled from the back cover 20.

The connecting plate 80 is located between the connecting piece 25 and the rotating member 50. The connecting plate 80 defines a small curved hole 81 and a big curved hole 84 coupled to the small curved hole 81. A radial width of the big curved hole 84 is greater than a radial width of the small curved hole 81, and the big curved hole 84 is positioned further away from the bottom edge 24 than the small curved hole 81. When the hook portion 54 is inserted into the big curved hole 84 and rotated toward the small curved hole 81, the hook portion 54 is hooked onto the sliding rail 22. One end of the small curved hole 81 away from the big curved hole 84 is positioned between two ends of the sliding rail 22. In this way, when the support frame 32 is rotated from the first position to the second position, the hook portion 54 moved along the sliding rail 22 toward the end of the small curved hole 81 away from the big curved hole 84 is prevented from being removed from the sliding rail 22.

The positioning assembly 40 includes a head portion 42, a shaft portion 44 coupled to the head portion 42, and a threaded portion 46 coupled to the shaft portion 44. The rotating member 50 is rotationally sleeved over the shaft portion 44. A bolt 60 is screwed onto the threaded portion 46 to rotationally fix the rotating member 50 between the head portion 42 and the threaded portion 46. The support frame 32 defines at least one fixing hole 38. The rotating member 50 defines at least one through hole 56. At least one fixing member (not shown) is passed through the at least one through hole 56 and received within the at least one fixing hole 38 to fix the rotating member 50 to the support frame 32. In at least one embodiment, the fixing hole 38 is a threaded hole, and the fixing member is a screw.

The fixing plate 72 is coupled to the shaft portion 44 and located between the rotating member 50 and the head portion 42. The connecting plate 80 is coupled to the fixing plate 72, and the connecting plate 80 is correspondingly coupled to the positioning assembly 40. The connecting plate 80 defines a through hole (not shown). The head portion 42 is received within the through hole of the connecting plate 80. An outer surface of the shaft portion 44 includes two first curved surfaces 48 and two first planar surfaces 49. The first curved surfaces 48 are spaced from the first planar surfaces 49. The fixing plate 72 defines a positioning hole 74. An inner wall of the positioning hole 74 includes two oppositely facing second curved surfaces 76 and two oppositely facing second planar surfaces 78. The two first curved surfaces 48 correspond to the two second curved surfaces 76, and the two first planar surfaces 49 correspond to the two second planar surfaces 78, so that the fixing plate 72 is sleeved over and fixed to the shaft portion 44.

The connecting structure 70 further includes a cover 71. The cover 71 is located on a side of the rotating member 50 away from the back cover 20. The cover 71 is coupled to the rotating member 50. An outer edge of the cover 71 is located on an outer edge of the rotating member 50 and covers the outer edge of the rotating member 50. The connecting structure 70 further includes a protective plate 73. The protective plate 73 defines a receiving hole 75 and is coupled to the connecting plate 80. The cover 71 is received within the receiving hole 75. The protective plate 73 is received within the accommodation area 28.

In the display device 100 as described above, the support structure 30 is installed onto the back cover 20 by rotating the support frame 32 after the connecting structure 70 is coupled to the back cover 20. Thus, installation is simple and convenient.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A display device comprising:
   a support structure comprising:
      a support frame comprising a support body and a support base coupled perpendicularly to the support body;
      a positioning assembly;
      a connecting structure comprising a connecting plate, wherein the connecting plate comprises at least one tab protruding from a periphery thereof; and
      a rotating member comprising a hook portion and coupled to the support frame and rotationally coupled to the positioning assembly; and
   a back cover coupled to the support structure, the back cover comprising a sliding rail protruding from a side thereof adjacent to the support frame and a bottom edge, the back cover defining a recessed portion surrounding an accommodation area, the recessed portion comprising a first side, a second side opposite to the first side, and a connecting piece between the first side and the second side, the first side defining at least one accommodation hole, the at least one tab being received within the at least one accommodation hole and the connecting plate abutting between the first side and the second side; wherein:
   the connecting plate is located between the connecting piece and the rotating member, the connecting plate defines a smaller curved hole and a bigger curved hole connected to the smaller curved hole, a radial width of the bigger curved hole is greater than a radial width of the smaller curved hole, and the bigger curved hole is further from the bottom edge than the smaller curved hole, when the hook portion is inserted through the bigger curved hole and rotated toward the smaller curved hole, the hook portion is hooked to the sliding rail, the connecting structure is connected to the back cover and the positioning assembly; and
   when the support frame rotates parallel to the back cover from a first position to a second position, the hook portion moves from one end of the sliding rail toward the sliding rail until the hook portion is hooked onto the sliding rail and the support structure is fixed to the back cover; when the support frame is in the first position, the support body is parallel to the bottom edge; when the support frame is in the second position, the support body is perpendicular to the bottom edge and supports the back cover.

2. The display device of claim 1, wherein one end of the smaller curved hole away from the bigger curved hole is positioned between two ends of the sliding rail.

3. The display device of claim 1, wherein:
   the connecting structure further comprises a cover located on a side of the rotating member away from the back cover;
   the cover is coupled to the rotating member;
   an outer edge of the cover is located on an outer edge of the rotating member and covers the outer edge of the rotating member.

4. The display device of claim 3, wherein:
   the connecting structure comprises a protective plate;
   the protective plate defines a receiving hole and is coupled to the connecting plate;
   the cover is received within the receiving hole; and
   the protective plate is received within the accommodating area.

5. The display device of claim 1, wherein:
   the positioning assembly comprises a head portion, a shaft portion coupled to the head portion, and a threaded portion coupled to the shaft portion;
   the rotating member is rotationally sleeved over the shaft portion;
   a bolt is screwed on the threaded portion; and
   the rotating member is rotationally coupled between the head portion and the threaded portion.

6. The display device of claim 5, wherein the connecting structure comprises a fixing plate coupled to the shaft portion and located between rotating member and the head portion.

7. The display device of claim 6, wherein:
- an outer surface of the shaft portion comprises two first arced surfaces and two planar surfaces;
- the first arced surfaces are spaced from the first planar surfaces;
- the fixing plate defines a positioning hole;
- an inner wall of the positioning hole comprises two second arced surfaces oppositely facing each other and two second planar surfaces oppositely facing each other; and
- the two first curved surfaces correspond to the two second curved surfaces, and the two first planar surfaces correspond to the two second planar surfaces.

* * * * *